(12) United States Patent
Cai et al.

(10) Patent No.: US 8,927,380 B2
(45) Date of Patent: Jan. 6, 2015

(54) SOI BIPOLAR JUNCTION TRANSISTOR WITH SUBSTRATE BIAS VOLTAGES

(75) Inventors: Jin Cai, Cortlandt Manor, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 13/369,261

(22) Filed: Feb. 8, 2012

(65) Prior Publication Data

US 2013/0200942 A1    Aug. 8, 2013

(51) Int. Cl.
*H01L 21/331* (2006.01)
*H01L 21/8222* (2006.01)

(52) U.S. Cl.
USPC ............ 438/311; 257/139; 257/526; 257/557

(58) Field of Classification Search
CPC ............... H01L 29/66265; H01L 27/1203
USPC ................ 257/139, 526, 557; 438/311
See application file for complete search history.

(56) References Cited

U.S. PATENT DOCUMENTS

| | | | | |
|---|---|---|---|---|
| 5,451,798 | A * | 9/1995 | Tsuda et al. | 257/139 |
| 5,627,401 | A * | 5/1997 | Yallup | 257/557 |
| 7,375,410 | B2 * | 5/2008 | Ho et al. | 257/526 |
| 7,573,077 | B1 * | 8/2009 | Ershov | 257/146 |
| 2004/0119136 | A1 * | 6/2004 | Cai et al. | 257/526 |

* cited by examiner

*Primary Examiner* — Jerome Jackson, Jr.
*Assistant Examiner* — Paul Budd
(74) *Attorney, Agent, or Firm* — Ido Tuchman; Louis L. Percello

(57) ABSTRACT

A circuit configuration and methods for controlling parameters of a bipolar junction transistor (BJT) fabricated on a substrate. A bias voltage is electrically coupled to the substrate and can be adjusted to alter the working parameters of a target BJT.

14 Claims, 6 Drawing Sheets

SOI BIPOLAR JUNCTION TRANSISTOR WITH SUBSTRATE BIAS VOLTAGES

BACKGROUND

This invention relates to bipolar junction transistors (BJTs), and more particularly to controlling parameters of a BJT fabricated on a substrate by applying a bias voltage to the substrate.

In bipolar junction transistors, the output current, or collector current, is exponentially dependent on the input voltage, or base-emitter voltage. This is different from MOSFET where the output current (Id) is more or less linearly dependent on input voltage, or gate voltage (Vg). This gives bipolar an advantage to be used in driver circuits where high current is needed to drive a load. However, BJTs have the limitation of needing relatively large input voltage to deliver sufficient current level. Unlike MOSFET where low threshold voltage can be achieved by tuning the work function of the gate material, BJTs made of silicon has a turn-on voltage around 0.9V-1V, which is dictated by the silicon band gap. Adding germanium to the base region can lower the turn on voltage due to the smaller bandgap of SiGe alloy as compared to silicon. However, this adds process complexity and cost. In addition, the amount of tuning is limited to the band gap shrinkage.

SUMMARY

Accordingly, one example aspect of the present invention is a method for controlling parameters of a bipolar junction transistor (BJT) fabricated on a substrate. The method includes electrically coupling a bias voltage to the substrate and adjusting the bias voltage to control parameters of the BJT.

Another example of the present invention is a method for selectively controlling a target bipolar transistor in a bipolar circuit. The bipolar circuit is fabricated on a substrate and includes at least one npn BJT transistor and at least one pnp BJT transistor. The method includes electrically coupling a substrate bias voltage to the substrate and adjusting the substrate bias voltage to control parameters of the target BJT.

Yet another example of the present invention is an integrated circuit including a substrate and a bipolar circuit fabricated on the substrate. The bipolar circuit includes at least one npn BJT transistor and at least one pnp BJT transistor. The integrated circuit also includes a target bipolar transistor in the bipolar circuit, and a controller configured to adjust a substrate bias voltage at the substrate to control parameters of the target transistor.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
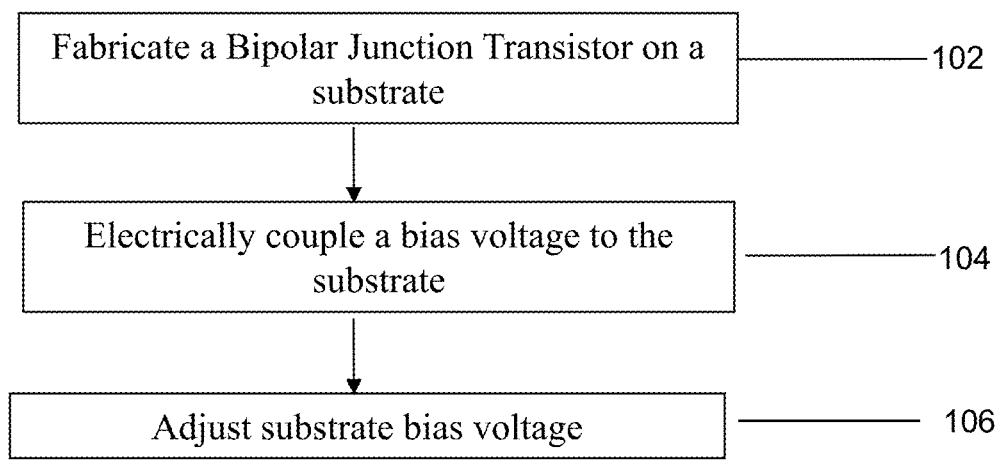
FIG. 1 shows a method for controlling parameters of a bipolar junction transistor fabricated on a substrate in accordance with one embodiment of the current invention.

The present invention is described with reference to embodiments of the invention. Throughout the description of the invention reference is made to FIGS. 1-6. When referring to the figures, like structures and elements shown throughout are indicated with like reference numerals.

FIG. 1 shows a method for controlling parameters of a bipolar junction transistor (BJT) 202 fabricated on a substrate 204 in accordance with one embodiment of the current invention. The method includes a fabrication step 102. During the fabrication step 102, a BJT 202 is fabricated on a substrate 204. After the completion of fabrication step 102, the method continues to coupling step 104.

At coupling step 104, a bias voltage 206 is electrically coupled to the substrate 204. In one embodiment, the bias voltage can be either a positive or negative DC, depending on the type of BJT transistor targeted for parameter control. The bias voltage is discussed in more detail below. After the coupling step 104 is completed, the method continues to adjusting step 106.

At adjusting step 106, the bias voltage 206 is adjusted to control parameters of the BJT 202. The amount of bias voltage 206 applied to the BJT 202 can be proportional to the thickness of the insulator layer 208. In addition, the bias voltage 206 may not exceed a threshold voltage when an inversion channel forms in the base region 210 of the BJT 202.

In one embodiment, the BJT 202 can be a npn BJT 404, and the bias voltage 206 may be a positive voltage. Adjusting the bias voltage 206 can include increasing the bias voltage 206 to increase a current gain of the BJT 202 and decreasing the bias voltage 206 to decrease the current gain of the BJT 202. Furthermore, adjusting the bias voltage 206 can include increasing the bias voltage to decrease a threshold voltage of the BJT 202. Conversely, decreasing the bias voltage can increase the threshold voltage of the BJT 202.

In another embodiment, the BJT 202 can be a pnp BJT, and the bias voltage 206 may be a negative voltage. Adjusting the bias voltage 206 can include decreasing the bias voltage 206, i.e., increasing the magnitude of the negative voltage, to increase a current gain of the BJT 202 and increasing the bias voltage 206, i.e., decreasing the magnitude of the negative voltage, to decrease the current gain of the BJT 202. Furthermore, adjusting the bias voltage 206 can include decreasing the bias voltage to decrease a threshold voltage of the BJT 202 and increasing the bias voltage to increase the threshold voltage of the BJT 202.

Figure 2:
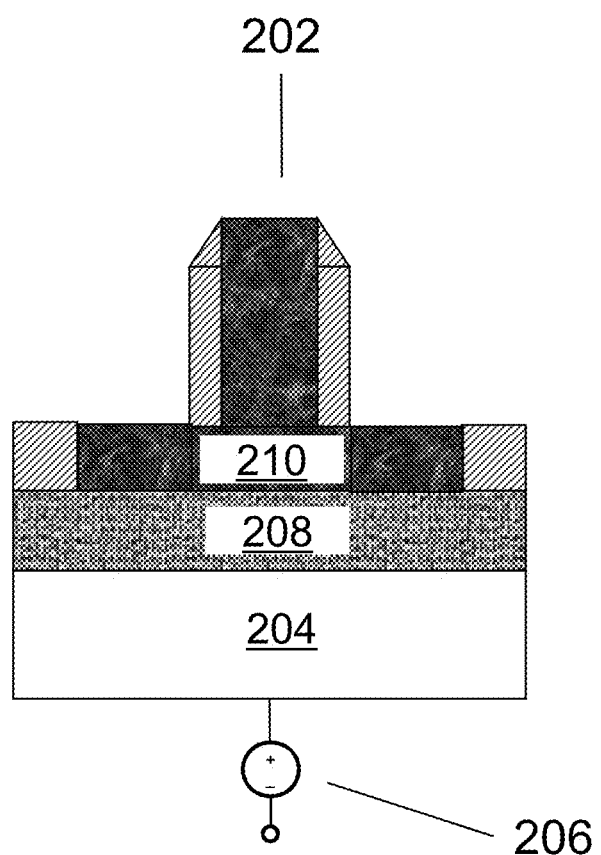
FIG. 2 shows a BJT with a bias voltage 206 according to the method described in FIG. 1 in accordance with one embodiment of the current invention.

FIG. 2 shows a BJT 202 with a bias voltage 206 applied according to the method described in FIG. 1 in accordance with one embodiment of the current invention. As shown, the bias voltage 206 is a positive DC voltage with respect to the base voltage of the BJT. Thus, if the BJT 202 is a pnp transistor, the bias voltage decreases the current gain and increases threshold voltage of the BJT 202. On the other hand, if the BJT 202 is a npn transistor, the bias voltage increases the current gain and decreases threshold voltage of the BJT 202.

In one embodiment, the BJT can be a silicon-on-insulator (SOI) bipolar transistor including an insulator layer 208 between the BJT 202 and the substrate 204.

Figure 3:
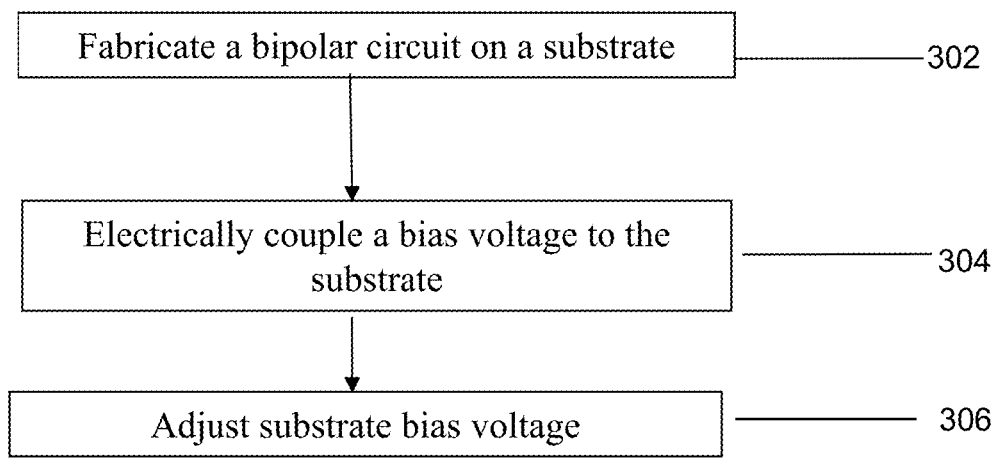
FIG. 3 shows a method for selectively controlling a target bipolar transistor in a bipolar circuit in accordance with one embodiment of the current invention.

FIG. 3 shows a method for selectively controlling a target bipolar transistor in a bipolar circuit in accordance with one embodiment of the current invention. The method includes a fabrication step 302. During the fabrication step 302, a bipolar circuit 402 is fabricated on a substrate 204. After the completion of fabrication step 302, the method continues to coupling step 304.

At coupling step 304, a bias voltage 206 is electrically coupled to the substrate 204. In one embodiment, the bias voltage can be either a positive or negative DC, depending on the type of BJT transistor targeted for parameter control. The bias voltage is discussed in more detail below. After the coupling step 304 is completed, the method continues to adjusting step 306.

At adjusting step 306, the bias voltage 206 is adjusted to control parameters of the target BJT of the bipolar circuit 402. The amount of bias voltage 206 applied to the target BJT can be proportional to the thickness of the insulator layer 208. In addition, the bias voltage 206 may not exceed a threshold voltage when an inversion channel forms in the base region 210 of the BJT 202.

In one embodiment, the target BJT can be a npn BJT 404, and the bias voltage 206 may be a positive voltage. Adjusting the bias voltage 206 can include increasing the bias voltage 206 to increase the current gain of the BJT 202 and decreasing the bias voltage 206 to decrease the current gain of the target BJT. Furthermore, adjusting the bias voltage 206 can include increasing the bias voltage to decrease the threshold voltage of the BJT 202. Conversely decreasing the bias voltage can increase the threshold voltage of the target BJT.

In another embodiment, the target BJT can be a pnp BJT 406, and the bias voltage 206 may be a negative voltage. Adjusting the bias voltage 206 can include decreasing the bias voltage 206, i.e., increasing the magnitude of the negative voltage, to increase a current gain of the BJT 202 and increasing the bias voltage 206, i.e., decreasing the magnitude of the negative voltage, to decrease the current gain of the target BJT. Furthermore, adjusting the bias voltage 206 can include decreasing the bias voltage to decrease a threshold voltage of the target BJT, and conversely, increasing the bias voltage can increase the threshold voltage of the target BJT.

Figure 4:
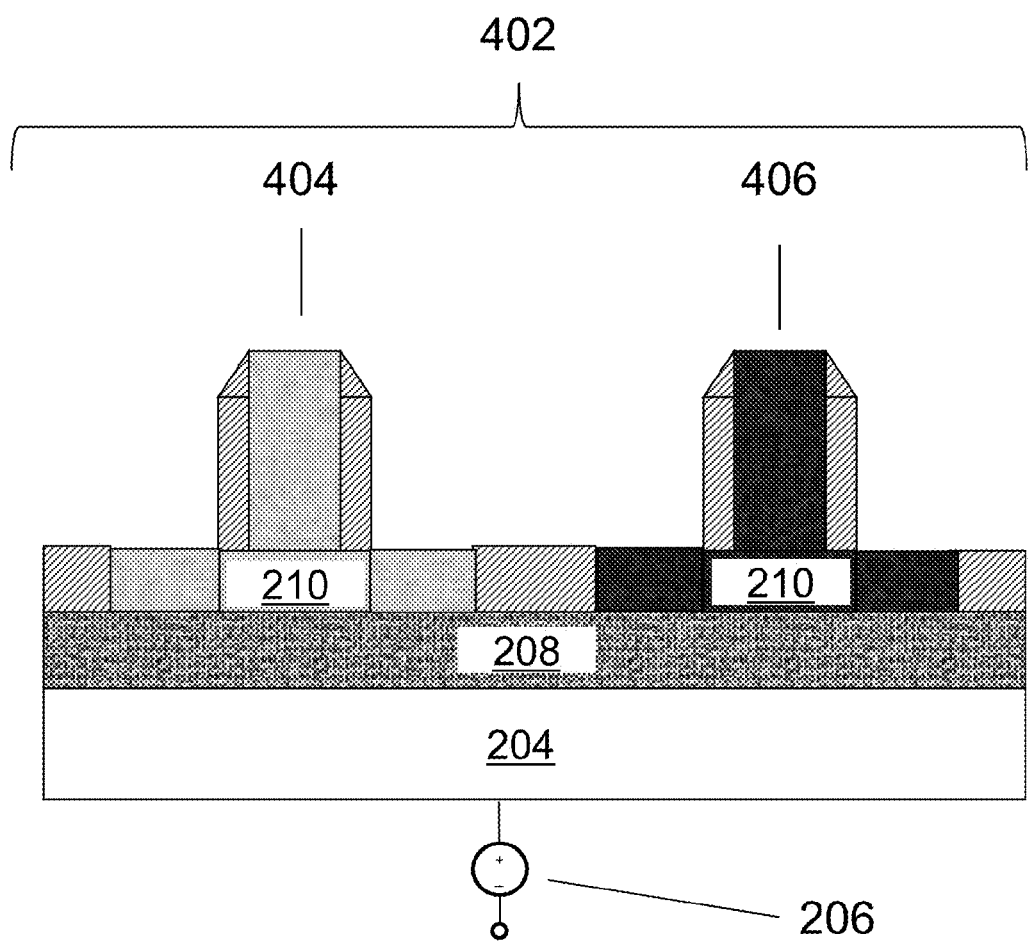
FIG. 4 shows a bipolar circuit with a bias voltage according to the method described in FIG. 3 in accordance with one embodiment of the current invention.

FIG. 4 shows a bipolar circuit 402 with a bias voltage 206 according to the method described in FIG. 3 in accordance with one embodiment of the current invention. The bipolar circuit 402 can include at least one npn BJT transistor 404 and at least one pnp BJT transistor 406. As shown, the bias voltage 206 is a positive DC voltage with respect to the base voltage of the target BJT. Thus, if the target BJT is a pnp BJT 406, the bias voltage 206 can decrease the current gain and increase threshold voltage of the target BJT. On the other hand, if the target BJT is a npn BJT 404, the bias voltage 206 can increase the current gain and decrease threshold voltage of the target BJT.

In one embodiment, the bipolar circuit 402 can be a silicon-on-insulator (SOI) bipolar circuit including an insulator layer 208 between the bipolar circuit 402 and the substrate 204.

Figure 5:
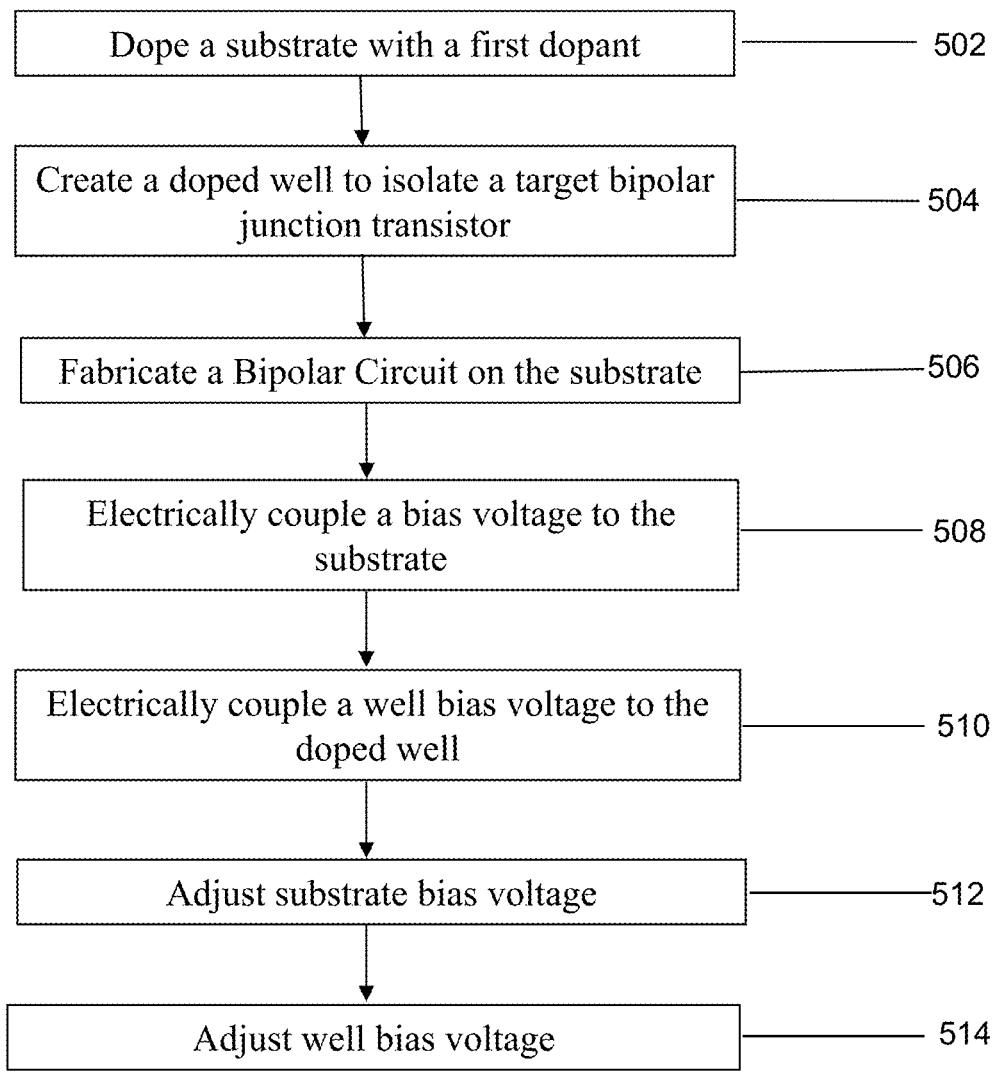
FIG. 5 shows a method for selectively controlling a target bipolar transistor electrically isolated from the substrate in a bipolar circuit in accordance with one embodiment of the current invention.

FIG. 5 shows a method for selectively controlling a target bipolar transistor electrically isolated from the substrate in a bipolar circuit in accordance with one embodiment of the current invention. The method includes a doping step 502. During the doping step 502, the substrate is doped one type of dopant. After the completion of doping step 502, the method continues to creation step 504.

At creation step 504, a doped well 602 is created within the substrate 204. The doped well 602 can be doped with a second type of dopant that has an opposite polarity from the dopant present in the substrate. After the completion of creation step 504, the method continues to fabrication step 506.

At fabrication step 506, a bipolar circuit 402 is fabricated on a substrate 204. After the completion of fabrication step 506, the method continues to coupling step 508.

At coupling step 508, a bias voltage 206 is electrically coupled to the substrate 204. In one embodiment, the bias voltage can be either a positive or negative DC, depending on the type of BJT transistor targeted for parameter control. After the coupling step 508 is completed, the method continues to another coupling step 510.

At coupling step 510, a second bias voltage 604 is electrically coupled to the doped well 602. In one embodiment, the well bias voltage 604 can be either a positive or negative DC (with respect to the base voltage of the target BJT), depending on the type of BJT transistor targeted for parameter control. After the coupling step 510 is completed, the method continues to adjusting step 512.

At adjusting step 512, the substrate bias voltage 206 can be adjusted to control parameters of a BJT 202 of the bipolar circuit 402 not isolated by the doped well 602. The amount of bias voltage 206 applied to the BJT can be proportional to the thickness of the insulator layer 208. In addition, the bias voltage 206 may not exceed a threshold voltage when an inversion channel forms in the base region 210 of the BJT. At the completion of adjusting step 512, the method continues adjusting step 514.

At adjusting step 514, the well bias voltage 604 can be adjusted to control parameters of the target BJT isolated from the substrate 204 by the doped well 602. Furthermore, the well bias voltage 604 can be less than a threshold voltage when an inversion channel forms in the base region 210 of the target BJT.

If the desired well voltage is more positive than the substrate voltage, a n-type dopant can be used for the well and a p-type dopant can be used for the substrate, and vice versa.

Figure 6:
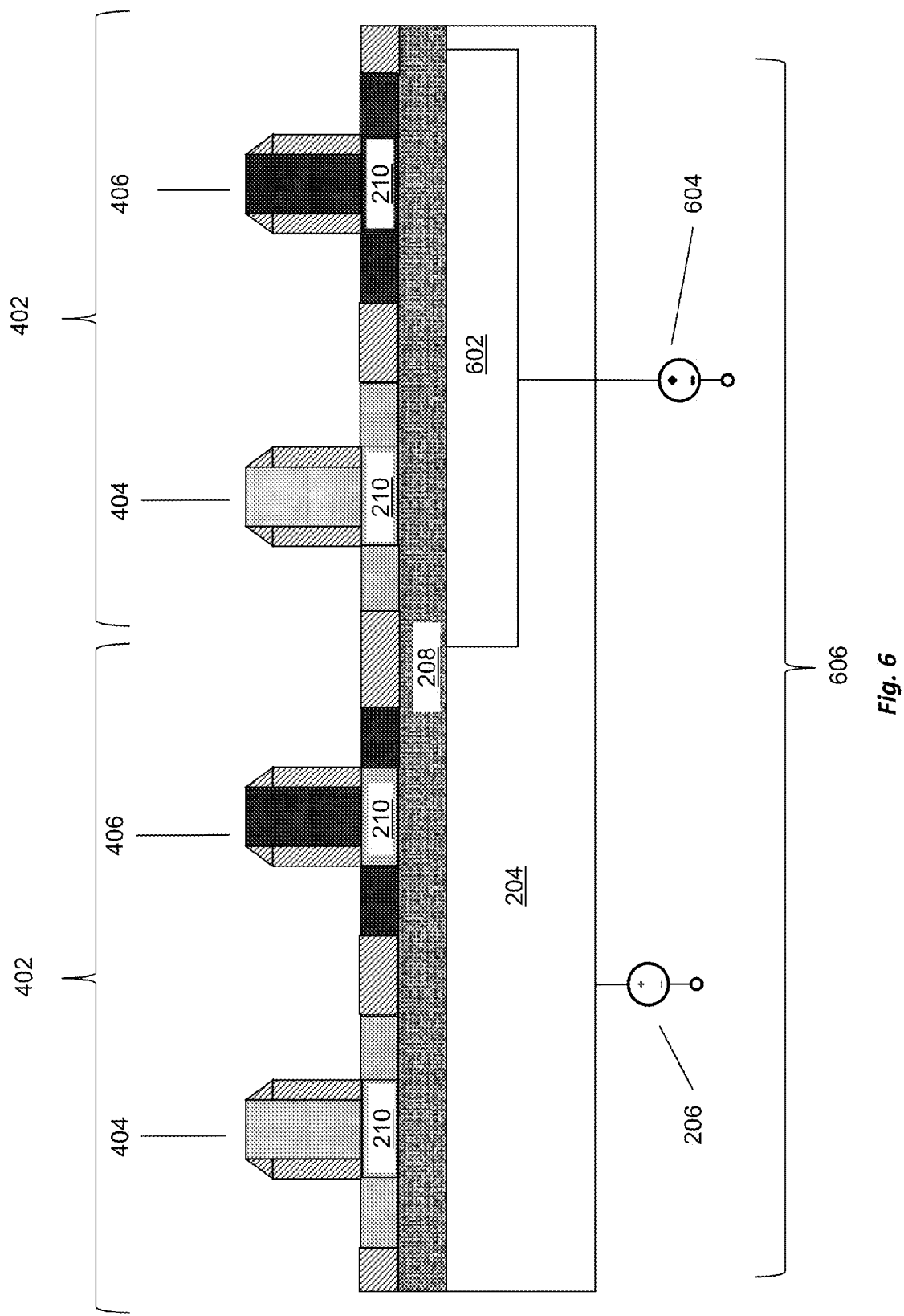
FIG. 6 shows an integrated circuit according to one embodiment of the present invention.

FIG. 6 shows an integrated circuit 606 according to one embodiment of the present invention. The integrated circuit 606 can include a substrate 204 and a bipolar circuit 402 fabricated on the substrate 204. The bipolar circuit 402 may include at least one npn BJT transistor 404 and at least one pnp BJT transistor 406. Furthermore, a controller can be configured to adjust a substrate bias voltage 206 at the substrate 204 to selectively control a target transistor in the integrated circuit 606.

In one embodiment, the integrated circuit can have the target bipolar transistor electrically isolated by a doped well 602. In addition, the controller can be further configured to adjust a well bias voltage 604 to the doped well 602, and the well bias voltage 604 can be different than the substrate bias voltage 206. Furthermore, the doped well 602 may be doped with a first dopant and the substrate 204 maybe be doped with a second dopant that has the opposite polarity from the first dopant.

In one embodiment, the target BJT may be a npn BJT 404, and the substrate bias voltage 206 may be a positive one. Furthermore, the controller adjusts the substrate bias voltage 206 by increasing the substrate bias voltage 206 to increase a current gain of the target BJT and decreasing the substrate bias voltage 206 to decrease the current gain of the target BJT.

In one embodiment, the target BJT may be a pnp BJT 406, and the substrate bias voltage 206 may be a negative one.

Furthermore, the controller adjusts the substrate bias voltage 206 by increasing the magnitude of the substrate bias voltage 206 to increase a current gain of the target BJT and decreasing the magnitude of the substrate bias voltage 206 to decrease the current gain of the target BJT.

Accordingly, one embodiment of the invention is a transistor fabricated on a substrate, with a bias voltage electrically coupled to the substrate. The transistor can be a Silicon-on-Insulator (SOI) bipolar junction transistor (BJT) with an insulator layer between the BJT and the substrate. According to an embodiment of the invention, adjusting the substrate bias voltage can lead to a lower turn-on voltage for the transistor, because the bias voltage can create a vertical field in the insulator layer, which can reduce the barrier height for minority carrier injection into the BJT's base region from BJT's emitter. The BJT's collector current (Ic) is also increased due to the increased flow of charges injected from the emitter into the base where they are minority carriers that diffuses toward the collector. This arrangement can also increase the barrier height for minority carrier injection from the base into the emitter and therefore reduce the BJT's base current (Ib). The increase in the collector current can improve the BJT's current gain, which is dictated by Ic/Ib. In addition, increasing the collector current via the application of a bias voltage can lead to increased speed for the BJT, because transistor frequency $f_T$ is directly proportional to collector current value $$\frac{1}{2\pi f_T} = \tau_F + \frac{kT}{qI_C}(C_{BE} + C_{BC}) + C_{BC}(r_e + r_c)$$

Furthermore, the amount of bias voltage applied to the BJT can be adjusted in proportionality to the thickness of the insulator layer. For applications where lower substrate bias voltage is desirable, a thinner insulator layer may be used.

One embodiment of the invention is a method for selectively controlling a target bipolar transistor in a bipolar circuit. The bipolar circuit may be a silicon-on-insulator (SOI) bipolar circuit fabricated on a substrate with an insulator layer between the bipolar circuit and the substrate. The bipolar circuit can include at least one npn BJT and at least one pnp BJT, and have a bias voltage electrically coupled to the substrate. The amount of bias voltage applied to the substrate can be adjusted in proportionality to the thickness of the insulator layer. For applications where lower substrate bias voltage is desirable, a thinner insulator layer may be used.

In one embodiment the target bipolar transistor may be a npn BJT, and the applied substrate bias voltage can be a positive voltage. Increasing the substrate bias voltage can contribute to a lowered turn-on voltage for the target transistor, and an increase in the target transistor's collector current. The increase in the collector current can contribute to a higher current gain for the target transistor and an increase in operation speed.

In another embodiment the target bipolar transistor may be a pnp BJT, and the applied substrate bias voltage can be a negative voltage. Decreasing the substrate bias voltage, i.e., increasing the magnitude of the negative voltage, can contribute to a lowered turn-on voltage for the target transistor, and an increase in the target transistor's collector current. The increase in the collector current can contribute to a higher current gain for the target transistor and an increase in operation speed.

Furthermore, the target transistor can be electrically isolated from the substrate by a doped well. This can be achieved by doping the substrate with a first dopant and doping the doped well with a second dopant that has the opposite polarity from the first dopant. In addition to the applied substrate bias voltage, a different well bias voltage can be electrically coupled to the doped well.

Yet another embodiment of the present invention is an integrated circuit fabricated on a substrate. The integrated circuit may be a silicon-on-insulator (SOI) circuit with an insulator layer between the circuit and the substrate. The integrated circuit can have at least one bipolar circuit which includes at least one npn BJT and at least one pnp BJT, and have a bias voltage electrically coupled to the substrate. The amount of bias voltage applied to the integrated circuit can be adjusted in proportionality to the thickness of the insulator layer. For applications where lower substrate bias voltage is desirable, a thinner insulator layer may be used.

The substrate bias voltage can be used to control the parameters of the target transistor. In one embodiment the target bipolar transistor may be a npn BJT, and the applied substrate bias voltage can be a positive voltage. Increasing the substrate bias voltage can contribute to a lowered turn-on voltage for the target transistor, and an increase in the target transistor's collector current. The increase in the collector current can contribute to a higher current gain for the target transistor and an increase in operation speed. In another embodiment the target bipolar transistor may be a pnp BJT, and the applied substrate bias voltage can be a negative voltage. Decreasing the substrate bias voltage, i.e., increasing the magnitude of the negative voltage, can contribute to a lowered turn-on voltage for the target transistor, and an increase in the target transistor's collector current. The increase in the collector current can contribute to a higher current gain for the target transistor and an increase in operation speed.

Furthermore, the integrated circuit can have a doped well which electrically isolates a target transistor from the substrate. The doped well can have a type of dopant that is opposite in polarity from the type of dopant present in the substrate. In addition, the doped well can be electrically coupled to a second bias voltage that is different from the substrate bias voltage. The well bias voltage can be adjusted to control the parameters of the isolated target transistor. In one embodiment the target bipolar transistor may be a npn BJT, and the applied substrate bias voltage can be a positive voltage. Increasing the substrate bias voltage can contribute to a lowered turn-on voltage for the target transistor, and an increase in the target transistor's collector current. The increase in the collector current can contribute to a higher current gain for the target transistor and an increase in operation speed.

In another embodiment the target bipolar transistor may be a pnp BJT, and the applied substrate bias voltage can be a negative voltage. Decreasing the substrate bias voltage, i.e., increasing the magnitude of the negative voltage, can contribute to a lowered turn-on voltage for the target transistor, and an increase in the target transistor's collector current. The increase in the collector current can contribute to a higher current gain for the target transistor and an increase in operation speed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for controlling parameters of a bipolar junction transistor (BJT) fabricated on a substrate, the method comprising:
    electrically coupling a bias voltage to the substrate; and
    adjusting the bias voltage;
    electrically coupling a well bias voltage to a doped well, the well bias voltage being different than the bias voltage, the target bipolar transistor is electrically isolated from the substrate by the doped well; and
    adjusting the well bias voltage;
    wherein the substrate is doped with a first dopant and the doped well is doped with a second dopant that has opposite polarity from the first dopant.

2. The method of claim 1, further comprising:
    wherein the BJT is a npn BJT;
    wherein the bias voltage is a positive voltage with reference to a base voltage of the BJT; and
    wherein adjusting the bias voltage includes increasing the bias voltage to increase a current gain of the BJT and decreasing the bias voltage to decrease the current gain of the BJT.

3. The method of claim 2, wherein adjusting the bias voltage includes increasing the bias voltage to decrease a threshold voltage of the BJT and decreasing the bias voltage to increase the threshold voltage of the BJT.

4. The method of claim 1, further comprising:
    wherein the BJT is a pnp BJT;
    wherein the bias voltage is a negative voltage with reference to a base voltage of the BJT; and
    wherein adjusting the bias voltage includes increasing the magnitude of the negative bias voltage to increase the current gain of the BJT and decreasing the magnitude of the negative bias voltage to decrease the current gain of the BJT.

5. The method of claim 4, wherein adjusting the bias voltage includes increasing the magnitude of the negative bias voltage to decrease a threshold voltage of the BJT and decreasing the magnitude of the negative bias voltage to increase the threshold voltage of the BJT.

6. The method of claim 1, wherein the BJT is a silicon-on-insulator (SOI) bipolar transistor including an insulator layer between the BJT and the substrate.

7. The method of claim 6, wherein the amount of bias voltage applied to the BJT is proportional to the thickness of the insulator layer.

8. A method for selectively controlling a target bipolar transistor in a bipolar circuit, the bipolar circuit is fabricated on a substrate and includes at least one npn BJT transistor and at least one pnp BJT transistor, the method comprising:
    electrically coupling a substrate bias voltage to the substrate; and
    adjusting the substrate bias voltage;
    electrically coupling a well bias voltage to a doped well, the well bias voltage being different than the substrate bias voltage, the target bipolar transistor is electrically isolated from the substrate by the doped well; and
    adjusting the well bias voltage;
    wherein the substrate is doped with a first dopant and the doped well is doped with a second dopant that has opposite polarity from the first dopant.

9. The method of claim 8, further comprising:
    wherein the target BJT is a npn BJT;
    wherein the substrate bias voltage is a positive voltage with reference to a base voltage of the BJT; and
    wherein adjusting the substrate bias voltage includes increasing the substrate bias voltage to increase a current gain of the target BJT and decreasing the substrate bias voltage to decrease the current gain of the target BJT.

10. The method of claim 9, wherein adjusting the substrate bias voltage includes increasing the substrate bias voltage to decrease the threshold voltage of the target BJT and decreasing the substrate bias voltage to increase the threshold voltage of the target BJT.

11. The method of claim 8, further comprising:
    wherein the target BJT is a pnp BJT;
    wherein the substrate bias voltage is a negative voltage with reference to a base voltage of the BJT; and
    wherein adjusting the substrate bias voltage includes decreasing the substrate bias voltage and increasing the magnitude of the negative voltage to increase a current gain of the target BJT, and increasing the substrate bias voltage and decreasing the magnitude of the negative voltage to decrease the current gain of the target BJT.

12. The method of claim 11, wherein adjusting the substrate bias voltage includes decreasing the substrate bias voltage and increasing the magnitude of the negative voltage to decrease a threshold voltage of the target BJT, and increasing the substrate bias voltage and decreasing the magnitude of the negative voltage to increase the threshold voltage of the target BJT.

13. The method of claim 8, wherein the bipolar circuit is a silicon-on-insulator (SOI) bipolar circuit including an insulator layer between the bipolar circuit and the substrate.

14. The method of claim 13, wherein the amount of substrate bias voltage applied to the bipolar circuit is proportional to the thickness of the insulator layer.

* * * * *